(12) United States Patent
Jiang (10) Patent No.: US 8,022,536 B2
(45) Date of Patent: Sep. 20, 2011

(54) SEMICONDUCTOR SUBSTRATE FOR BUILD-UP PACKAGES

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/642,356

(22) Filed: Dec. 18, 2009

(65) Prior Publication Data

US 2010/0096761 A1    Apr. 22, 2010

Related U.S. Application Data

(63) Continuation of application No. 11/538,344, filed on Oct. 3, 2006, now Pat. No. 7,635,611, which is a continuation of application No. 10/365,998, filed on Feb. 12, 2003, now Pat. No. 7,135,780.

(51) Int. Cl.
  *H01L 23/34*   (2006.01)
  *H01L 23/48*   (2006.01)
  *H01L 23/52*   (2006.01)
  *H01L 29/40*   (2006.01)

(52) U.S. Cl. ......... 257/723; 257/777; 257/783; 257/775

(58) Field of Classification Search ................... 257/723, 257/777, 783, 782, 776, 774, 775, 772
See application file for complete search history.

(56) References Cited

U.S. PATENT DOCUMENTS

| | | | |
|---|---|---|---|
| 3,903,590 A | 9/1975 | Yokogawa | |
| 4,866,501 A | 9/1989 | Shanefield | |
| 5,073,814 A | 12/1991 | Cole, Jr. et al. | |
| 5,280,192 A | 1/1994 | Kryzaniwsky | |
| 5,315,486 A | 5/1994 | Fillion et al. | |
| 5,324,687 A | 6/1994 | Wojnarowski | |
| 5,331,203 A | 7/1994 | Wojnarowski et al. | |
| 5,422,435 A | 6/1995 | Takiar et al. | |
| 5,432,677 A | 7/1995 | Mowatt et al. | |
| 5,434,751 A | 7/1995 | Cole, Jr. et al. | |
| 5,527,741 A | 6/1996 | Cole et al. | |
| 5,546,654 A | 8/1996 | Wojnarowski et al. | |
| 5,565,706 A * | 10/1996 | Miura et al. | 257/723 |
| 5,745,984 A * | 5/1998 | Cole et al. | 29/834 |
| 5,757,072 A | 5/1998 | Gorowitz et al. | |
| 5,808,874 A | 9/1998 | Smith | |
| 5,837,427 A | 11/1998 | Hwang et al. | |
| 5,841,193 A | 11/1998 | Eichelberger | |
| 5,866,952 A | 2/1999 | Wojnarowski et al. | |
| 5,886,412 A | 3/1999 | Fogal et al. | |
| 5,936,305 A | 8/1999 | Akram | |
| 5,975,408 A | 11/1999 | Goossen | |
| 6,000,127 A | 12/1999 | Eifuku et al. | |

(Continued)

*Primary Examiner* — Chuong A. Luu
(74) *Attorney, Agent, or Firm* — Schwegman, Lundberg & Woessner, P.A.

(57) ABSTRACT

The present invention provides techniques to fabricate build-up single or multichip modules. In one embodiment, this is accomplished by dispensing die-attach material in one or more pre-etched cavities on a substrate. A semiconductor die is then placed over each pre-etched cavity including the die-attach material by urging a slight downward pressure on the substrate such that an active surface of each placed semiconductor die is disposed across from the substrate and is further substantially coplanar with the substrate. The semiconductor die is then secured to the substrate by curing the die-attach material. A miniature circuit board, including one or more alternating layer of dielectric material and metallization structures, is then formed over the substrate and the active surface of each semiconductor die to electrically interconnect the semiconductor dies.

13 Claims, 7 Drawing Sheets

U.S. PATENT DOCUMENTS

| | | | |
|---|---|---|---|
| 6,057,593 | A | 5/2000 | Iovdalsky et al. |
| 6,107,121 | A | 8/2000 | Diffenderfer et al. |
| 6,137,183 | A * | 10/2000 | Sako ............................ 257/783 |
| 6,159,767 | A | 12/2000 | Eichelberger |
| 6,175,161 | B1 | 1/2001 | Goetz et al. |
| 6,181,569 | B1 | 1/2001 | Chakravorty |
| 6,202,298 | B1 | 3/2001 | Smith |
| 6,214,642 | B1 | 4/2001 | Chen et al. |
| 6,274,391 | B1 | 8/2001 | Wachtler et al. |
| 6,350,668 | B1 | 2/2002 | Chakravorty |
| 6,368,896 | B2 | 4/2002 | Farnworth et al. |
| 6,389,691 | B1 | 5/2002 | Rinne et al. |
| 6,423,570 | B1 | 7/2002 | Ma et al. |
| 6,437,240 | B2 | 8/2002 | Smith |
| 6,506,664 | B1 | 1/2003 | Beyne et al. |
| 6,518,163 | B2 | 2/2003 | Sakuyama et al. |
| 6,521,530 | B2 | 2/2003 | Peters et al. |
| 6,555,906 | B2 | 4/2003 | Towle et al. |
| 6,617,687 | B2 | 9/2003 | Akram et al. |
| 6,709,897 | B2 | 3/2004 | Cheng et al. |
| 6,709,898 | B1 | 3/2004 | Ma et al. |
| 6,734,534 | B1 | 5/2004 | Vu et al. |
| 6,756,662 | B2 | 6/2004 | Infantolino et al. |
| 6,867,499 | B1 | 3/2005 | Tabrizi |
| 6,921,968 | B2 | 7/2005 | Chung |
| 6,960,518 | B1 * | 11/2005 | Tsao et al. .................... 438/616 |
| 6,964,881 | B2 | 11/2005 | Chua et al. |
| 7,109,063 | B2 | 9/2006 | Jiang |
| 7,135,780 | B2 | 11/2006 | Jiang |
| 7,635,611 | B2 | 12/2009 | Jiang |
| 2002/0004257 | A1 | 1/2002 | Takaoka et al. |
| 2002/0074641 | A1 * | 6/2002 | Towle et al. ................... 257/692 |
| 2003/0164548 | A1 * | 9/2003 | Lee ............................. 257/738 |
| 2004/0042190 | A1 | 3/2004 | Eng et al. |
| 2004/0043533 | A1 | 3/2004 | Chua et al. |
| 2005/0085014 | A1 | 4/2005 | Jiang |
| 2007/0082429 | A1 | 4/2007 | Jiang |

* cited by examiner

SEMICONDUCTOR SUBSTRATE FOR BUILD-UP PACKAGES

CROSS REFERENCE TO RELATED APPLICATIONS

This application is a Continuation of U.S. application Ser. No. 11/538,344, filed Oct. 3, 2006, now U.S. Pat. No. 7,635,611 which is a Continuation of U.S. application Ser. No. 10/365,998, filed Feb. 12, 2003, now issued as U.S. Pat. No. 7,135,780. These applications are incorporated herein their entirety by reference.

FIELD OF THE INVENTION

The present invention relates to semiconductor devices and, in particular, to single and multichip packages.

BACKGROUND OF THE INVENTION

The conventional approach to electronic packaging and interconnection has been to package individual integrated circuit (IC) chips in a single package and to attach these packages to a printed circuit board to provide interconnection between the individual IC chips. In recent years, this approach has met with problems of speed, size, and interconnection density due to ever constant demands for reduced size and increased performance from such integrated circuit packages.

One solution to many of the above problems is the multichip module (MCM). In an MCM, bare (unpackaged) IC chips are interconnected by means of a miniature printed circuit board whose interconnection pitch may match the pitch of the IC chip. There are presently two main classes of MCM. These are the "chips last MCM" and the "chips first MCM". In the chips last MCM, the miniature circuit board is fabricated first and then the bare IC chips are attached and interconnected to the circuit board. The method of interconnection is usually wire bond or solder bump. In the chips first MCM, the chips are placed and bonded to a substrate, and a miniature circuit board is then built above the chips. The method of interconnection, usually entails forming IC chips as an integral part of the processing of the circuit board. Currently, the industry uses build-up technology to interconnect IC chips in the chips first MCM. Build-up technology to interconnect IC chips in the chips first MCM is generally known. One such technique that is relevant to the present subject matter is discussed in U.S. Pat. No. 6,159,767.

As mentioned above, the chips first MCM requires placing the IC chips first relative to each other on a substrate. It is generally difficult to maintain consistency during placement and bonding of the IC chips onto a substrate. The inconsistencies in placing and bonding IC chips onto a substrate generally result in coplanarity and alignment problems between the IC chips and the substrate.

Generally, a thicker dielectric layer is required in forming the miniature circuit board over the IC chips to overcome the above-described inconsistency problems. The thicker the dielectric layer, the higher the thermal buildup and the mechanical stress generated during post-processing operations of the multichip module. In addition, the thickness of the dielectric layer formed over the IC chips can vary substantially due to coplanarity problems between the upper surfaces of the IC chips and the dielectric layer. In addition, the cost of raw material used in forming the dielectric layer increases due to its increased thickness. Further, variations in the thickness of the dielectric layer can cause changes in the dielectric properties, such as capacitance. Furthermore, variations in the thickness of the dielectric layer can cause post-processing problems, such as metal deposition rate, varying etch rate, metal coverage, and so on, which can ultimately result in a lower yield.

Thus, there is a need in the art for a technique to form MCMs using build-up technology that can overcome the above-described problems.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, electrical, and process changes may be made without departing from the teachings of the invention.

In the foregoing description of the preferred embodiments, various features of the invention are grouped together in a single embodiment for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single disclosed embodiment. Thus, the following claims are hereby incorporated into the description of the preferred embodiments, with each claim standing on its own as a separate preferred embodiment of the invention.

The term 'substrate' used in the following description may include materials, such as silicon, silicon-on insulator (SOI), silicon-on sapphire (SOS), doped and undoped semiconductors, epitaxial layers of silicon supported by a base semiconductor foundation, silica, ceramic, alumina, metals, organic materials, and other semiconductor structures. The semiconductor need not be silicon-based. The semiconductor could be silicon-germanium, germanium, or gallium arsenide. When reference is made to a wafer or substrate in the following description, previous process steps may be utilized to form regions, junctions, or layers in or on the base semiconductor or foundation.

The terms "semiconductive wafer fragment" or "wafer fragment" or "wafer" will be understood to mean any construction comprising semiconductor material, including but not limited to, bulk semiconductive materials, such as a semiconductor wafer (either alone or in assemblies comprising other material thereon) and a semiconductive material layer (either alone or in assemblies comprising other materials).

The terms "cavity", "well", and "pre-etched cavity" are used interchangeably throughout this specification. The term "active side" means the circuit side of a chip. The terms "chip", or "IC chip", or "semiconductor chip", or "semiconductor die" will be understood to mean an integrated circuit or other electronic component containing a semiconductor as a base material, and are used interchangeably throughout this specification.

The present invention provides techniques to fabricate a build-up single or multichip package. In some embodiments, the build-up multichip package may include a memory circuit including an array of memory cells disposed on a substrate and/or a logic circuit including an array of memory cells disposed on a substrate.

Figure 1:
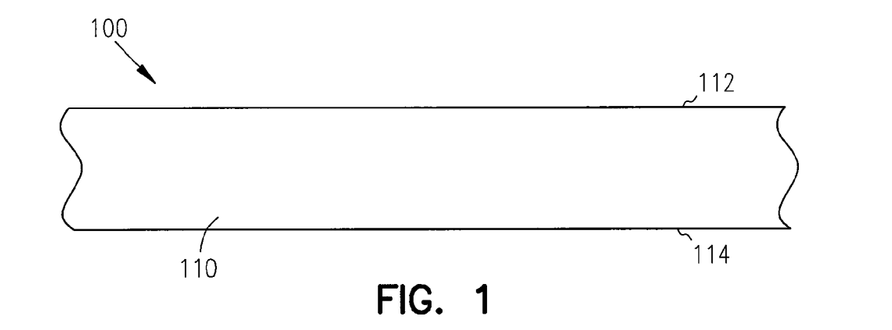
FIGS. 1, 2, 3, 4, 5, 7, 8, 9, 10, 11, and 12 are cross-sectional views of a semiconductor wafer fragment that illustrate sequential fabrication operations of a build-up multichip module according to an embodiment of the present invention.

FIGS. 1, 2, 3, 4, and 5 are cross-sectional views of a portion of semiconductor wafer fragment 100 illustrating one embodiment of sequential operations for forming one or more pre-etched cavities 140 on a substrate 110. The operation begins with a substrate 110 having top and bottom surfaces 112 and 114 as shown in FIG. 1. The substrate 110 can include semiconductor-based materials, such as silicon-on insulator (SOI), silicon-on sapphire (SOS), doped and undoped semiconductors, epitaxial layers of silicon supported by a base semiconductor foundation, silica, alumina, ceramic, and/or other semiconductor-based materials. The semiconductor-based materials can also include materials, such as silicon-germanium, germanium, and/or gallium arsenide.

Figure 2:
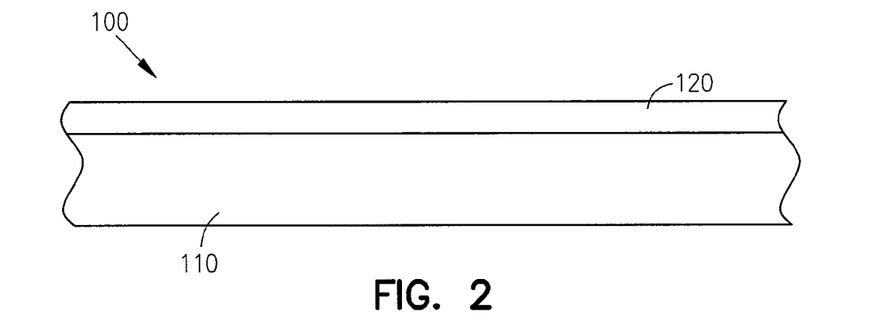
Figure 3:
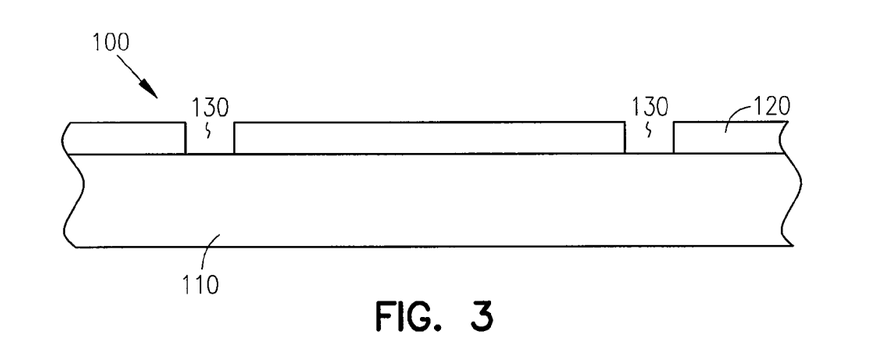
Figure 4:
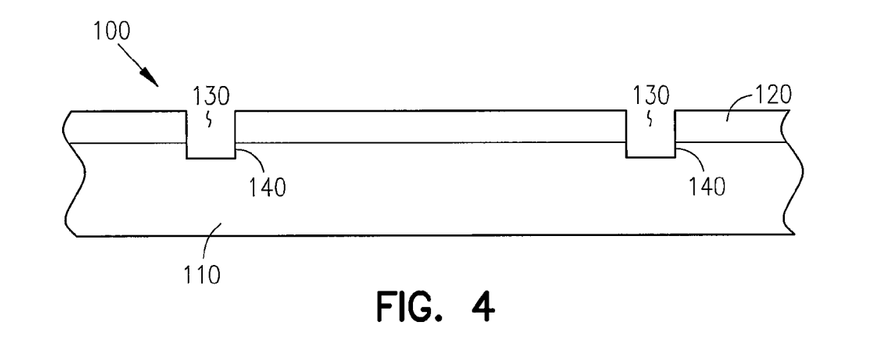

FIG. 2 illustrates deposition of a photoresist layer 120 to mask the top surface 112 of the substrate 110. A suitable photoresist layer comprises photoresist film JSR IX405 made by JSR Microelectronics. FIG. 3 illustrates exposing and developing photoresist layer 120 to form photoresist pattern 130. Photoresist pattern 130 can be developed based on desired shapes and locations for one or more pre-etched cavities 140 as shown in FIG. 4. One or more pre-etched cavities 140 can also be one or more wells.

FIG. 4 illustrates etching the photoresist layer 120 including photoresist pattern 130 using a solvent that is selective to photoresist layer 120 to form one or more pre-etched cavities 140. Solvents, such as KOH etchant, wet etchant, and/or dry etchant can be used to etch one or more pre-etched cavities 140. A suitable dry etch comprises exposing the photoresist layer 120 to $CF_4$ or $C_2F_6$, among others.

Figure 5:
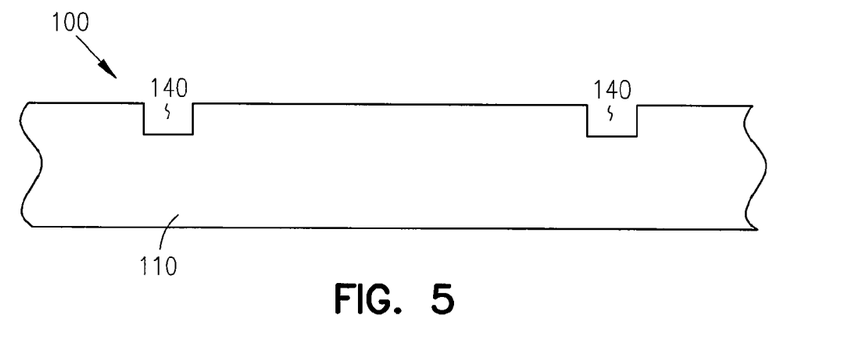

As depicted in FIG. 5, photoresist layer 120 is removed after etching the one or more pre-etched cavities 140, as shown in FIG. 4, to expose the formed one or more pre-etched cavities 140. A wet etchant, such as acetone or s photoresist stripper, such as Shipley's SVC-14 made by Strippers Corporation, among others can be used to remove the photoresist layer 120. Pre-etched cavities 140 can also be formed using other conventional processing techniques known to one skilled in the art.

Figure 6:
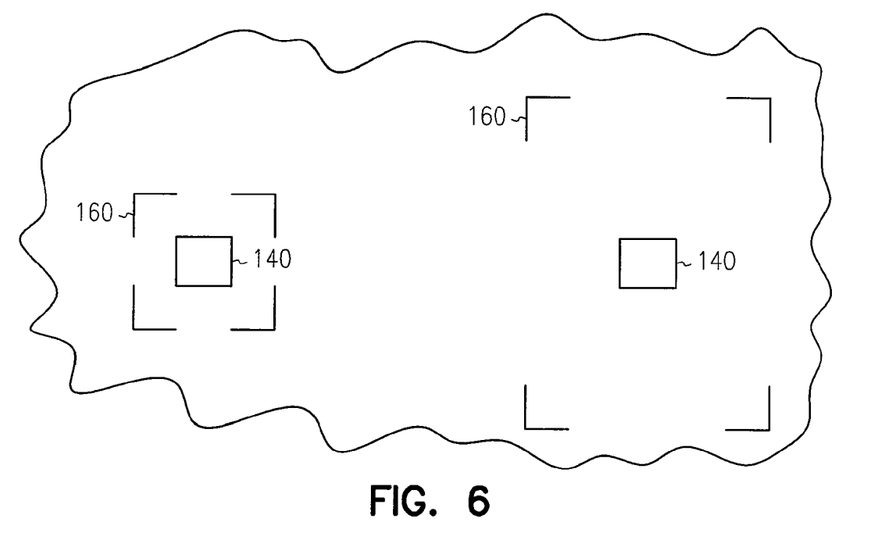
FIG. 6 is a top-down view of the semiconductor wafer fragment shown in FIG. 5.

FIG. 6 is a top view of semiconductor wafer fragment 100 shown in FIG. 5. FIG. 6 shows alignment marks 160 in addition to one or more pre-etched cavities 140 shown in FIG. 5. The alignment marks 160 are disposed around each of the one or more pre-etched cavities 140. Alignment marks 160 can also be formed using etching operations described above with reference to FIGS. 4 and 5. In these embodiments, alignment marks 160, such as those shown in FIG. 6, are used by pick-and-place machines to aid them in accurately aligning and placing the chips over the one or more pre-etched cavities 140. Alignment marks 160 help place the chips substantially accurately in both X and Y dimensions, as well as in holding the chip faces parallel in the same plane. Each of the alignment marks 160 is disposed at the outer boundaries of the chip placement area of an associated chip to be placed over a cavity 140 as shown in FIG. 6.

Figure 7:
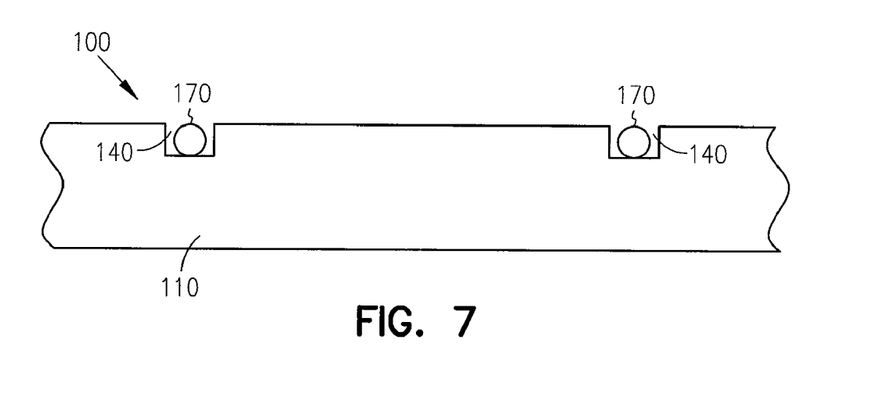

Referring to FIG. 7, die-attach material 170 is then dispensed in each of the one or more pre-etched cavities 140. The die-attach material 170 can include materials such as epoxy, polyimide, polyolefin, and BCB. A suitable die-attach material is a Dexter 536. The die-attach material 170 can be dispensed using processes, such as screen-printing, pneumatic dispensing, and positive dispensing. Dispensing equipment, such as a pick-and-place machine, a die-bonder, and/or die-attach equipment can be used to dispense the die-attach material. A suitable dispensing machine is a Datacom 2200apm dispensing machine.

Figure 8:
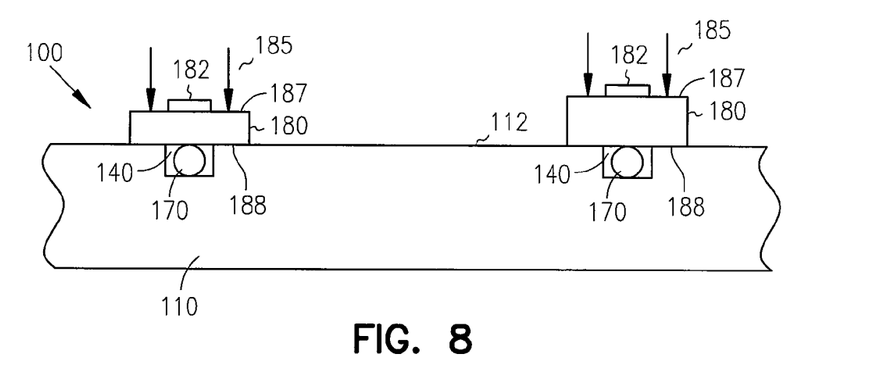

As shown in FIG. 8, a chip 180 is placed over each cavity 140, including die-attach material 170, with a slight downward force, as indicated by arrows 185, such that top surface 187 of each chip 180 is parallel with the top surface 112 of substrate 110. In these embodiments, each chip 180 is placed over each cavity 140 such that the active surface is on top surface 187. The active surface 187 can include one or more contact pads 182. In some embodiments, each chip is accurately placed over each cavity using a high accuracy pick-and-place machine, such as the Datacom 2200apm. Exemplary chips 180 are semiconductor chips, semiconductor dies, semiconductor chips, and IC chips.

Figure 9:
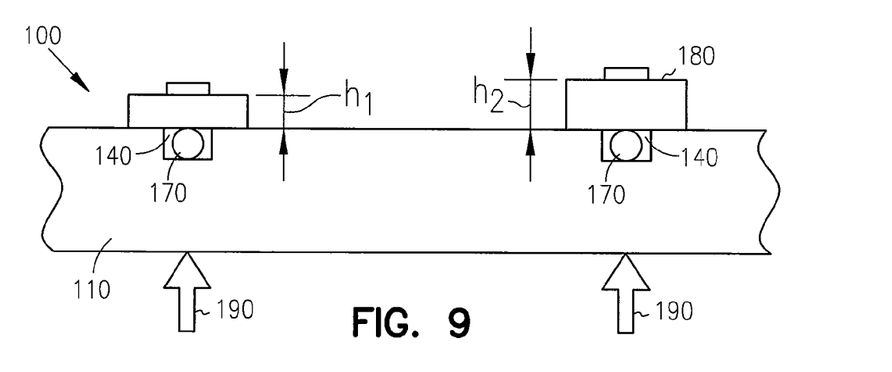

Referring to FIG. 9, each chip 180 is secured to the substrate 110 by curing the dispensed adhesive 170. The dispensed adhesive 170 holds each chip 180 in place after curing the adhesive 170. The adhesive 170 can be cured using a curing process, such as localized thermal curing, UV light curing (when a glass substrate is used), microwave curing, and/or infrared (IR) curing. In some embodiments, as indicated by directional arrows 190 in FIG. 9, localized thermal or UV light curing can be used to cure dispensed adhesive 170 in each cavity 140.

Figure 10:
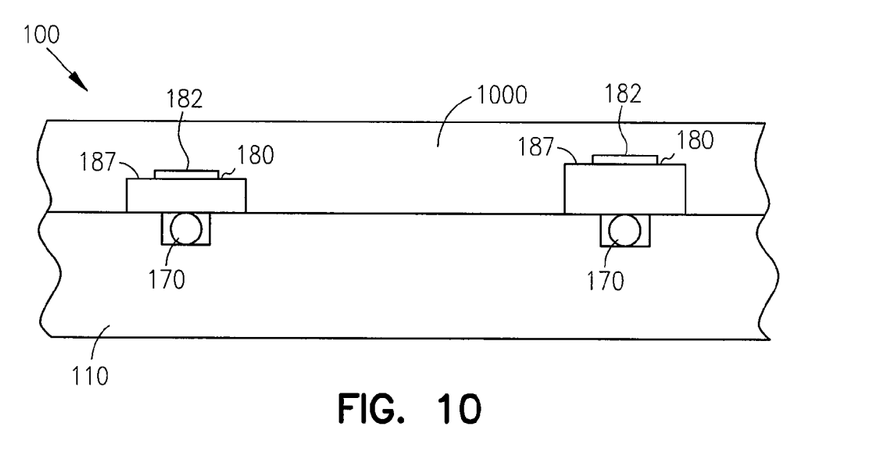

Referring to FIG. 10, after curing the dispensed adhesive 170, an encapsulating layer 1000 is deposited over the top surfaces of the substrate 112 and chips 187. In these embodiments, deposited encapsulating layer 1000 is substantially coplanar with the top surfaces of the substrate 112 and chips 187, because the top surface 187 of each placed chip 180 is substantially coplanar with the top surface 112 of the substrate 110, which results in consistent chip heights '$h_1$' and '$h_2$' as shown in FIG. 9. Therefore, only a thin encapsulating layer 1000 is needed over the top surfaces of substrate 112 and chips 187. Thinner encapsulating layer 1000 results in reduced thermal buildup and thermal stress during operation of the multichip module. In addition, variations in the thickness of the deposited encapsulating layer 1000 is considerably reduced due to the substantial coplanarity achieved between the top surfaces of substrate 112 and each of the chips 187. Reduced variation in the thickness of the encapsulating layer 1000 results in reduced variations in dielectric properties and post-processing problems, such as metal deposition rate, varying etch rate, and so on, which can ultimately result in a higher yield.

In some embodiments, encapsulating layer 1000 is a dielectric layer. In these embodiments, the dielectric layer can be formed using photo-patternable dielectric materials, such as polyimide, polyolefin, polynorbornene, Benzyl Cyclo Butane (BCB), and Poly Benzoxyzol (PBO). In these embodiments, dielectric layer 1000 is spray or spin coated over the top surfaces of the substrate 112 and each of the chips 187. The thickness of the dielectric layer can be in the range of 1 to 100 microns over the chip surface 187.

Figure 11:
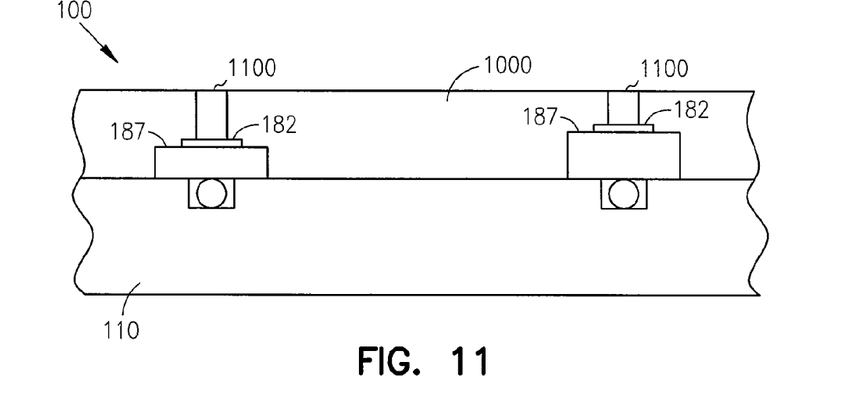

Referring to FIG. 11, via holes 1100 are formed in the dielectric layer 1000 to expose the at least one or more contact pads 182 at the upper surface 187 of each chip 180 for facilitating electrical connection on the dielectric layer 1000. In some embodiments, via holes are formed using an excimer laser.

Figure 12:
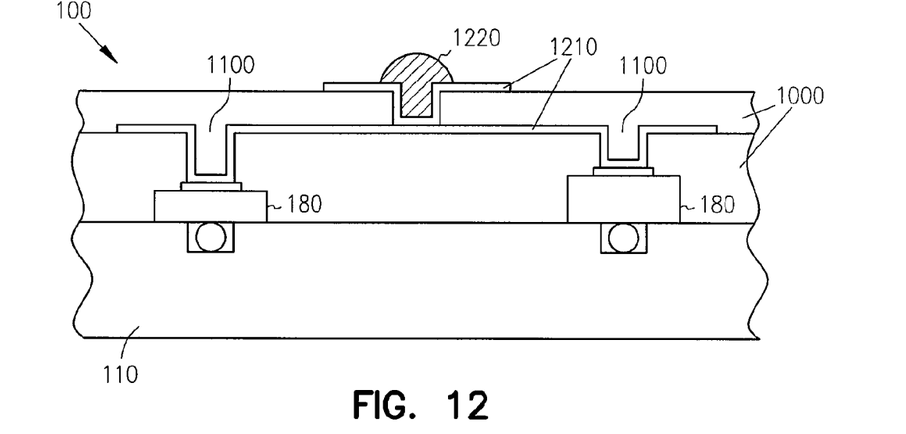

Referring to FIG. 12, metallization structures 1210 are formed over the dielectric layer 1000 and the via holes 1100 to interconnect the chips 180. In some embodiments, chip interconnection metallization structures 1210 are sputtered on the dielectric layer 1000 and via holes 1100. The metallization is subsequently built up electrolytically and patterned by photolithographic means. Additional interconnection layers are then built up as required by depositing dielectric layer 1000, forming via holes 1100, and metallizing structures 1210.

As shown in FIG. 12, input/output (I/O) structures 1220, such as solder bumps and/or gold-plated pad grids are formed over the metallization structures 1210. Gold-plated pad grid is achieved by pattern plating the copper to a thickness of approximately 1 micron or more, followed by plating nickel up to 5 microns and then gold up to 0.5 microns. Solder balls, and/or solder paste cones are placed at each site and reflowed to form the desired solder bumps. Note that solder bumps or connection pads can be placed directly above or offset to the side of the bare chips, thus allowing any desired I/O pad array configuration to be produced for the single packaged chip.

Figure 13:
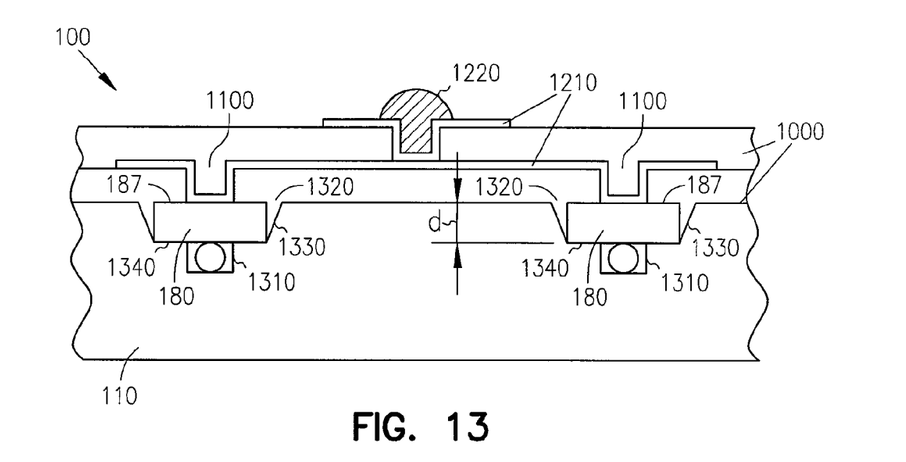
FIG. 13 is a cross-sectional view of a semiconductor wafer fragment that illustrates a multichip module fabricated according to another embodiment of the present invention.

FIG. 13 shows another embodiment in which chips 180 are placed inside a second cavity 1320. In this embodiment, die-attach material is dispensed in an earlier operation in a first cavity 1310. As shown in FIG. 13, first cavity 1310 is disposed below the second cavity 1320. In the embodiment shown in FIG. 13, first cavity 1310 is substantially concentric with the second cavity 1320. It can be envisioned that first cavity 1310 is offset from second cavity 1320. Second cavity 1320 is larger than first cavity 1310, as shown in FIG. 13. A recessed area 1340, similar to a chip placement area around the alignment marks 160 shown in FIGS. 5 and 6, is formed between the first and second cavities 1310 and 1320. The second cavity 1320 is large enough to receive an associated chip 180. In addition, second cavity 1320 has upwardly extending surfaces 1330 that extend from and around the recessed area 1340 as shown in FIG. 13. The upwardly extending surfaces 1330 help in substantially aligning chip 180 in X and Y dimensions during placement of each chip 180 in the second cavity 1320 and over the recessed area 1340.

The embodiment shown in FIG. 13 requires a substantially reduced thickness of the dielectric layer 1000 over the top surfaces of the substrate 112 and each chip 187 as compared to the embodiment shown in FIG. 12. Each chip 180 is placed inside the second cavity 1320 and the chip 180 protrusion beyond the top surface 112 of the substrate 110 can be reduced by controlling the depth 'd' of the second cavity 1320. As described above with reference to FIG. 10, a thinner dielectric layer reduces thermal stress and thermal build-up during operation of the single or multichip module. As shown in FIG. 13, dielectric layers 1000, via holes 1100, and metallizing structures 1210 are formed over the top surface 112 of the substrate 110 as described above with reference to FIGS. 10-12. Additional interconnection layers can then be built up as required by depositing dielectric layers 1000, forming via holes 1100, metallizing and patterning to form metallizing structures 1210.

Figure 14:
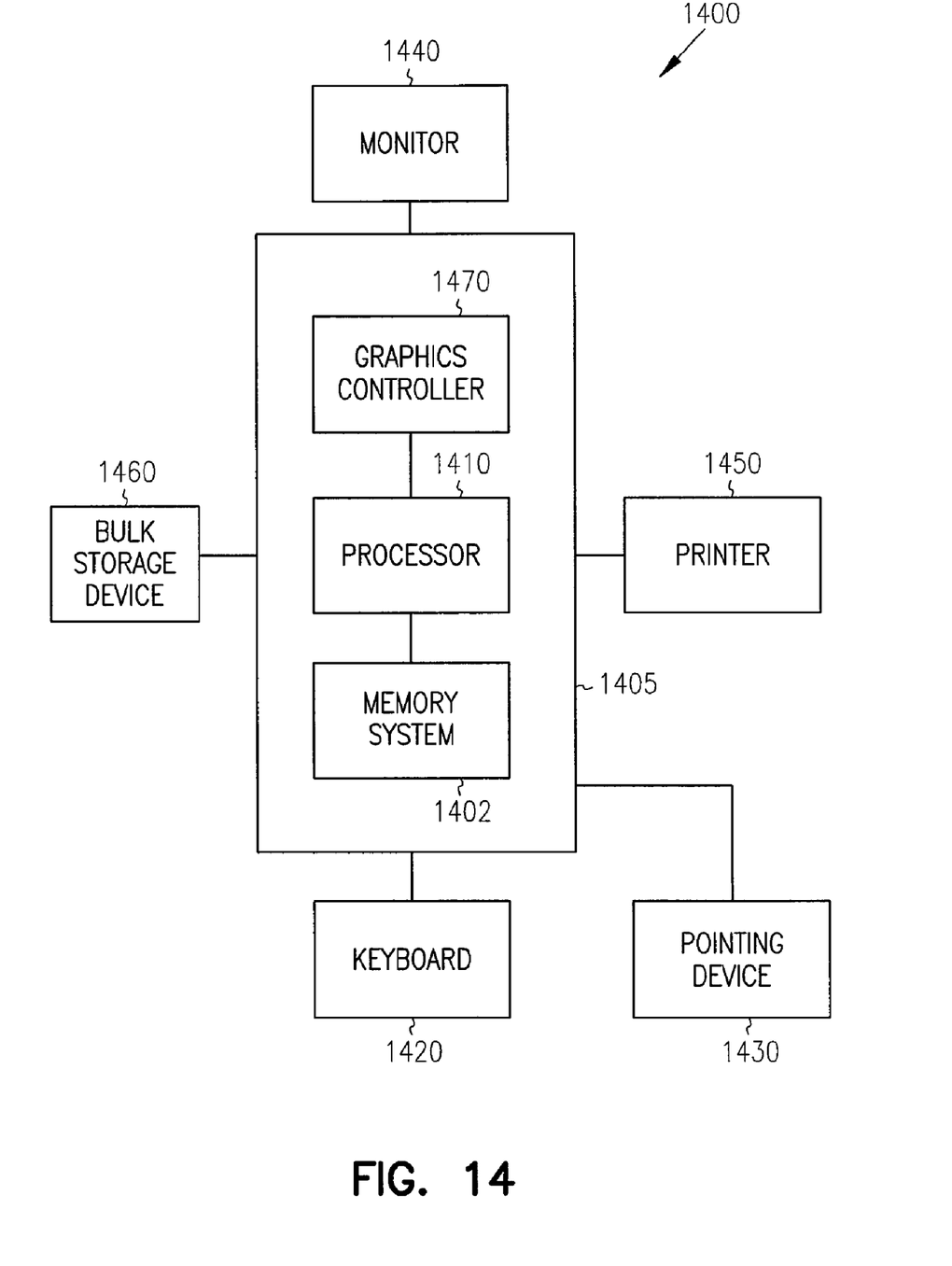
FIG. 14 is a block diagram of an exemplary computer system.

FIG. 14 is a block diagram of a system according to one embodiment of the present invention. Computer system 1400 contains a processor 1410 and a memory system 1402 housed in a computer unit 1405. Computer system 1400 is but one example of an electronic system containing another electronic system, e.g., memory system 1402, as a subcomponent. The memory system 1402 includes a memory device that includes a multichip module as discussed in various embodiments of the present invention. Computer system 1400 optionally contains user interface components. These user interface components include a keyboard 1420, a pointing device 1430, a monitor 1440, a printer 1450, and a bulk storage device 1460. It will be appreciated that other components are often associated with computer system 1400 such as modems, device driver cards, additional storage devices, etc. It will further be appreciated that the processor 1410 and memory system 1402 of computer system 1400 can be incorporated on a single integrated circuit. Such single-package processing units reduce the communication time between the processor and the memory circuit. Any of these components of the system may contain a multichip module that includes the build-up single or multichip module of the present invention. This is particularly true of graphics subsystem 1470 of FIG. 14 utilizing SGRAM that includes the multiple-mode output driver as discussed in various embodiments of the present invention.

Figure 15:
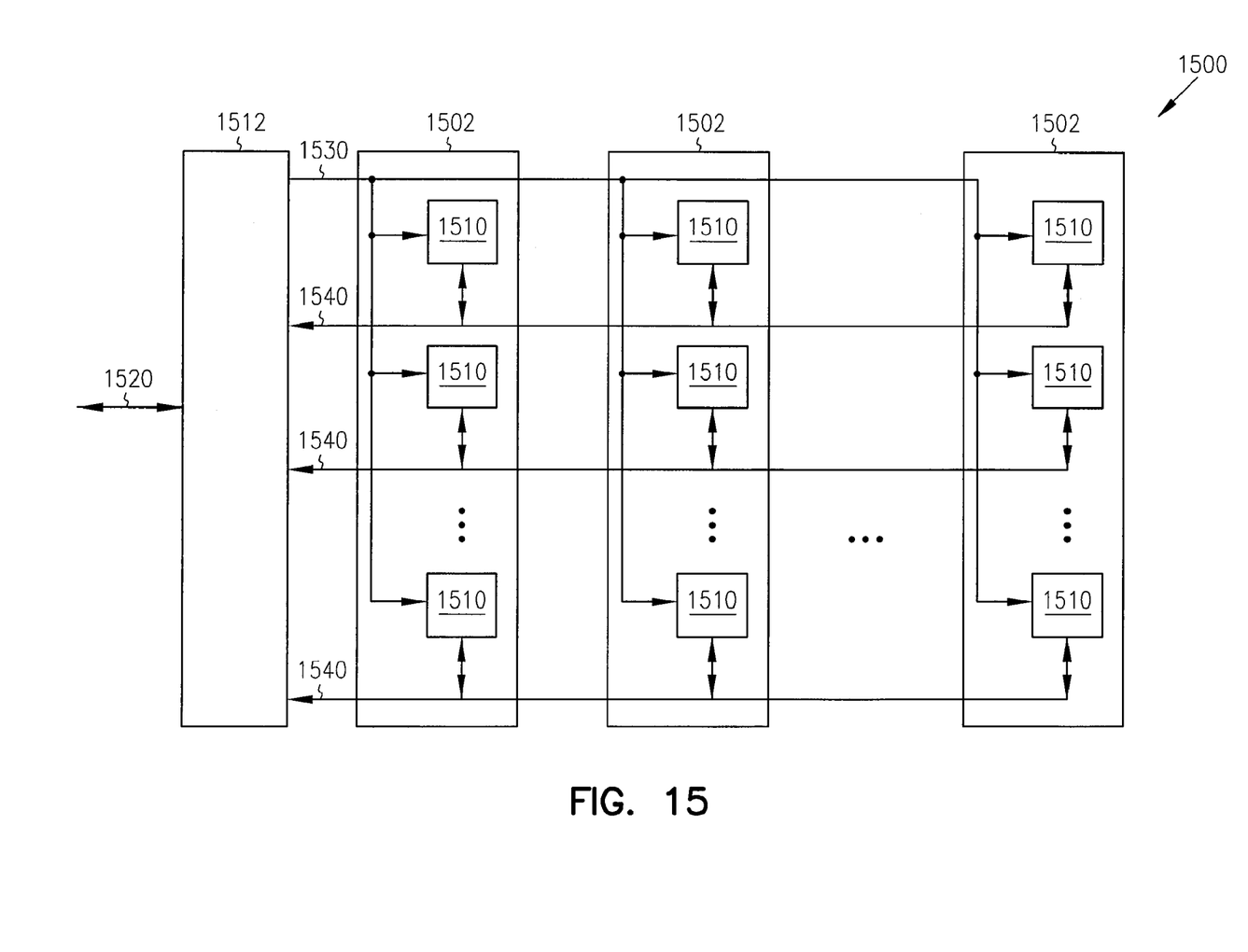
FIG. 15 is a block diagram of an exemplary memory system.
Figure 16:
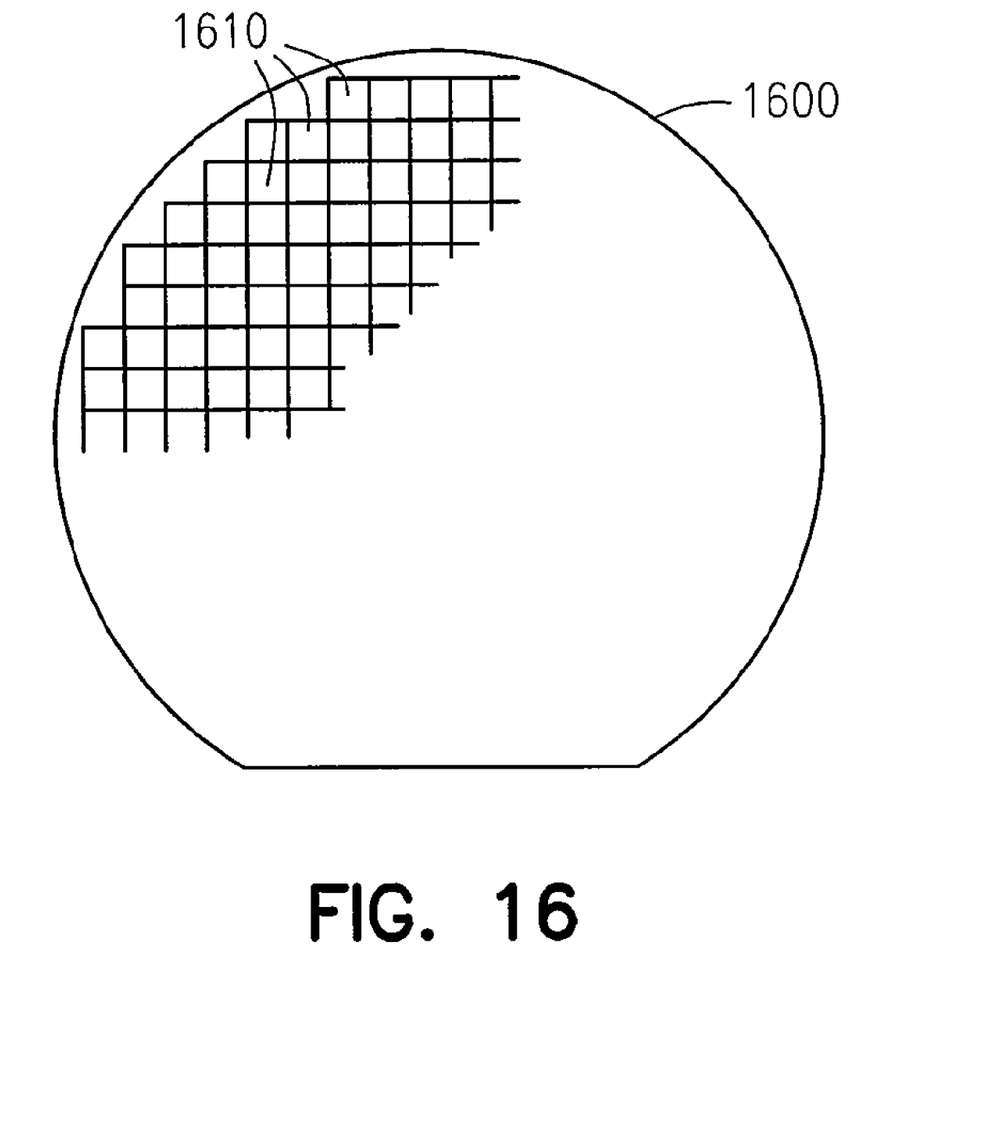
FIG. 16 is an elevational view of a substrate containing semiconductor dies.

FIG. 15 is a block diagram of a system according to one embodiment of the present invention. Memory system 1500 contains one or more multichip modules 1502 and a memory controller 1512. Each memory module 1502 includes at least one memory device 1510. Memory controller 1512 provides and controls a bidirectional interface between memory system 1500 and an external system bus 1520. Memory system 1500 accepts a command signal from the external bus 1520 and relays it to the one or more memory modules 1502 on a command link 1530. Memory system 1500 provides for data input and data output between the one or more memory modules 1502 and external system bus 1520 on data links 1540. At least one of the memory devices 1510 includes the single or multichip modules as discussed in various embodiments of the present invention. At least one of the memory devices 1510 includes the build-up multichip modules of the present invention. With reference to FIG. 16, in one embodiment, a semiconductor die 1610 is produced from a silicon wafer 1600. A die is an individual pattern, typically rectangular, on a substrate that contains circuitry to perform a specific function. A semiconductor wafer will typically contain a repeated pattern of such dies containing the same functionality. Die 1610 may contain multichip modules, as discussed above. Die 1610 may further contain additional circuitry to extend to such complex devices as a monolithic processor with multiple functionality. Die 1610 is typically packaged in single or multichip modules as discussed in various embodiments of the present invention.

Embodiments of the present invention provides techniques for fabricating a multichip module using build-up technology. In one aspect, the invention provides methods for forming a multichip module using build-up technology to interconnect semiconductor dies. In one embodiment of the methods, the multichip module is fabricated by dispensing die-attach material in one or more pre-etched cavities disposed on a substrate. A semiconductor die is then placed over each pre-etched cavity, including the die-attach material, by urging a slight downward pressure to place the semiconductor die to be substantially coplanar with the substrate. The semiconductor die is then secured to the substrate by curing the die-attach material. A miniature circuit board is then formed over the substrate and the secured semiconductor dies by forming a multilayer structure including alternating layers of dielectric and conductive materials that is substantially coplanar with the substrate to electrically interconnect the semiconductor dies.

In another aspect, the invention provides methods for forming a build-up multichip module on a silicon substrate. In one embodiment of the methods, the multichip module is formed by dispensing die-attach material in each of one or more first pre-etched cavities disposed on a substrate. An IC chip is then placed in each of one or more second pre-etched cavities that are associated with the one or more first pre-etched cavities such that each placed IC chip is disposed over the first pre-etched cavity including the die-attach material. A slight downward force is used while placing each IC chip over the first pre-etched cavities including the die-attach material so that each placed IC chip is substantially coplanar with the substrate. In addition, each IC chip is substantially accurately aligned by the walls of the second pre-etched cavity while placing the chip in the second pre-etched cavity. The placed IC chips are then secured to the substrate by curing the die-attach material. A dielectric layer is then formed over the substrate and the IC chips. Metallization structures are then formed over the dielectric material to electrically interconnect the IC chips.

In another aspect, the invention provides a multichip module. In one embodiment, the multichip module includes a substrate including one or more chip placement areas. Each chip placement area includes a pre-etched cavity. Each pre-etched cavity includes die-attach material. An IC chip overlies each chip placement area and over the die-attach material such that upper surfaces of the substrate and each IC chip are substantially coplanar. A miniature circuit board, including multiple layers of dielectric material and metallization structure, overlies the substrate and the IC chips to interconnect the IC chips.

In yet another aspect, the invention provides a multichip module. In one embodiment, the multichip module includes a substrate including one or more chip placement areas. Each chip placement area includes a pre-etched cavity and an associated alignment mark to aid in accurate alignment of a chip during placement of the chip over the chip placement area. Each cavity includes die-attach material. An IC chip overlies each of the one or more chip placement areas and the die-attach material such that the substrate and each IC chip are substantially coplanar. A miniature circuit board, including multiple alternating layers of dielectric material and metallization structures, overlies the substrate and the IC chips to interconnect the IC chips.

Additional advantages and features of the present invention will be more apparent from the detailed description and accompanying drawings, which illustrate preferred embodiments of the invention. The above description illustrates preferred embodiments, which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A module comprising:
    a substrate including a surface and a chip placement area disposed on the surface;
    a cavity disposed in the chip placement area;
    die-attach material having a majority portion of the die-attach material disposed in the cavity;
    an integrated circuit chip disposed over the cavity in the chip placement area and contacting the die-attach material;
    at least one additional chip placement area disposed on the surface of the substrate;
    an additional cavity disposed in the additional chip placement area;
    an additional die-attach material having a majority portion of the additional die-attach material disposed in the additional cavity; and
    an additional integrated circuit chip disposed over the additional chip placement area and contacting the additional die-attach material.

2. The module of claim 1, wherein the integrated circuit chip include a first contact pad, the additional integrated circuit includes a second contact pad, and wherein the module further comprises at least one metallization structure coupled to the first and second contact pads.

3. The module of claim 1, wherein the integrated circuit chip includes a first surface directly contacting the die-attach material, and a second surface opposite from the first surface, wherein the module further comprising:
    at least one contact pad on the second surface of the integrated circuit chip; and
    at least one metallization structure coupled to the at least one contact pad.

4. The module of claim 1, further comprising a dielectric layer disposed over the surface of the substrate and over at least a portion of the integrated circuit chip.

5. The module of claim 4, wherein the dielectric layer is a first dielectric layer and the module further comprises a second dielectric layer over the first dielectric layer, the module further comprising:
    a first metallization structure coupled to the integrated circuit chip through a portion of the first metallization structure in the first dielectric layer; and
    a second metallization structure coupled to the first metallization structure through a portion of the second metallization structure in the second dielectric layer.

6. The module of claim 1, wherein the substrate comprises ceramic material.

7. The module of claim 1, wherein the die-attach material comprises an epoxy material.

8. A module comprising:
    a chip placement area on a surface of a substrate;
    first and second cavities disposed in the chip placement area, the second cavity disposed above the first cavity, wherein the second cavity is larger than the first cavity;
    die-attach material disposed in the first cavity;
    a semiconductor chip disposed in the second cavity and over the first cavity and contacting the die-attach material; and
    a dielectric layer overlying the semiconductor chip.

9. The module of claim 8 further comprising:
    an additional chip placement area on the surface of the substrate;
    first and second additional cavities disposed in the additional chip placement area, the second additional cavity disposed above the first additional cavity, wherein the second additional cavity is larger than the first additional cavity;
    additional die-attach material disposed in the first additional cavity; and
    an additional semiconductor chip disposed in the second additional cavity and over the first additional cavity and contacting the additional die-attach material.

10. The module of claim 9 further comprising at least one metallization structure coupled to the semiconductor chip and the additional semiconductor chip.

11. The module of claim 8, wherein the second cavity has upwardly extending surfaces from a recessed area between the first and second cavities, and wherein the upwardly extending surfaces substantially surround the semiconductor chip.

12. The module of claim 8, wherein the semiconductor chip includes a first surface directly contacting the die-attach material, and a second surface opposite from the first surface, wherein the module further comprising:
   at least one contact pad coupled to the second surface of the second of the semiconductor chip; and
   at least one metallization structure coupled to the at least one contact pad.

13. The module of claim 8 wherein the substrate comprises gallium arsenide.

* * * * *